United States Patent
Gill et al.

(10) Patent No.: US 8,743,516 B2
(45) Date of Patent: Jun. 3, 2014

(54) SHARING STACKED BJT CLAMPS FOR SYSTEM LEVEL ESD PROTECTION

(75) Inventors: Chai Ean Gill, Chandler, AZ (US); Rouying Zhan, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 16 days.

(21) Appl. No.: 13/451,312

(22) Filed: Apr. 19, 2012

(65) Prior Publication Data

US 2013/0279051 A1  Oct. 24, 2013

(51) Int. Cl.
*H02H 9/00* (2006.01)
*H02H 9/04* (2006.01)
*H01L 27/02* (2006.01)

(52) U.S. Cl.
CPC ........... *H01L 27/0259* (2013.01); *H02H 9/041* (2013.01)
USPC .......................................................... 361/56

(58) Field of Classification Search
CPC .................... H01L 27/0259; H02H 9/041
USPC .......................................................... 361/56
See application file for complete search history.

(56) References Cited

U.S. PATENT DOCUMENTS

| 5,889,644 | A | 3/1999 | Schoenfeld et al. |
| 6,535,368 | B2 | 3/2003 | Andresen et al. |
| 7,027,278 | B1 | 4/2006 | Vashchenko et al. |
| 7,969,697 | B2 * | 6/2011 | Farzan et al. .................. 361/56 |
| 2010/0019341 | A1 * | 1/2010 | Gill et al. ...................... 257/487 |
| 2011/0175198 | A1 | 7/2011 | Zhan et al. |
| 2011/0176243 | A1 | 7/2011 | Zhan et al. |
| 2012/0293904 | A1 * | 11/2012 | Salcedo et al. ................ 361/111 |

FOREIGN PATENT DOCUMENTS

WO    2011156233 A1   12/2011

OTHER PUBLICATIONS

Extended European Search Report for EP Application No. 13161840.7 dated Jun. 19, 2013.

* cited by examiner

*Primary Examiner* — Scott Bauer
(74) *Attorney, Agent, or Firm* — Terrile, Cannatti, Chambers & Holland, LLP; Michael Rocco Cannatti

(57) ABSTRACT

An area-efficient, high voltage, dual polarity ESD protection device (200) is provided for protecting multiple pins (30, 40) against ESD events by using a plurality of stacked NPN devices (38, 48, 39) which have separately controllable breakdown voltages and which share one or common NPN devices (39), thereby reducing the footprint of the high voltage ESD protection circuits without reducing robustness and functionality.

23 Claims, 7 Drawing Sheets

US 8,743,516 B2

SHARING STACKED BJT CLAMPS FOR SYSTEM LEVEL ESD PROTECTION

BACKGROUND OF THE INVENTION

1. Field of the Invention

The present invention is directed in general to integrated circuit devices and methods for manufacturing same. In one aspect, the present invention relates to the manufacture and use of semiconductor devices used for electrostatic discharge (ESD) protection in integrated and other circuits.

2. Description of the Related Art

To protect against electrostatic discharge (ESD) events in integrated circuit devices, ESD protection or clamp devices are typically provided as voltage limiting devices across the inputs and/or other terminals of such integrated circuit devices. ESD protection devices are intended to remain quiescent during normal operation of the associated integrated circuit devices when used with normal operating voltage Vo, but turn on when excessive voltage arises, thereby preventing damage to any protected elements in the integrated circuit devices. Some ESD clamp circuits use bipolar transistors and/or silicon controlled rectifier circuits (a.k.a., thyristor circuits) between the protected terminals which turn "on" at an initial triggering threshold voltage Vt1, and conduct current when voltage across the protected terminals rises beyond a predetermined triggering threshold voltage or limit. The initial trigger voltage Vt1 is usually closely correlated to DC BV for breakdown-triggered devices. In operation, as the voltage applied to the terminals is increased, very little current flows through the ESD clamp circuit until the triggering threshold voltage Vt1 is reached, at which point the ESD clamp circuit begins conducting current up to a snapback point (defined by a higher holding current Isb and lower holding voltage Vsb) after which, depending upon the internal on-state resistance $R_{ON}$ of ESD claim circuit, the current and voltage may further increase to second trigger or breakdown point (Vt2, It2) beyond which destructive failure may occur leading to further current increase accompanied by voltage decrease.

Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
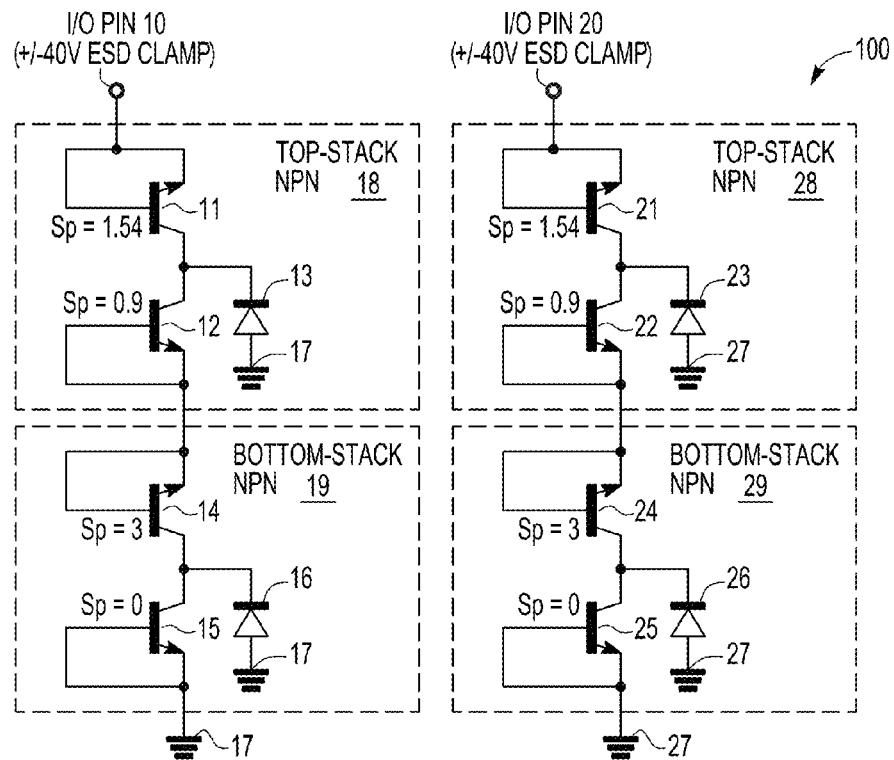
FIG. 1 shows a simplified circuit schematic diagram illustrating a plurality of pins, each protected by a separate ESD clamp formed with a dedicated stack of ESD protection devices.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

An ESD protection circuit and associated fabrication process are provided for protecting a plurality of pins against voltage fluctuations by using a plurality of ESD clamps which share one or more stacks of ESD protection devices, thereby reducing the footprint of the high voltage ESD protection circuits without reducing robustness and functionality. In selected embodiments, a configuration of stacked BJT clamps protect a plurality of pins connected to the same reference voltage (e.g., ground) by sharing one or more NPN-based ESD protection devices. By controlling a lateral base-collector spacing dimension in each NPN transistor, the shared NPN-based ESD protection device(s) can be used for multiple pins with same or different voltage tiers to maintain targeted parameters (e.g., Vt1, DC BV, Vsb, It2) while reducing the circuit footprint (e.g., by 25-38%) without requiring additional components. For example, instead of protecting two neighboring pins with two separate ESD clamps which each include two stacked NPN-based ESD devices (a top NPN stack and a bottom NPN stack), the ESD clamps for the two pins can share a common bottom NPN stack so that the ESD clamp for the first pin includes a first top NPN stack connected in series with the common bottom NPN stack, and the ESD clamp for the second pin includes a second top NPN stack connected in series with the common bottom NPN stack. In this way, the total number of NPN stacks is reduced from four to three, providing a 25% deduction in foot print. Thus, a high voltage, bipolar-based ESD protection device is formed to protect a plurality of pins with a compact arrangement of stacked NPN-based ESD devices, including a common bottom NPN-based ESD device. In addition, the disclosed ESD protection circuit has the flexibility of being used as a single or dual polarity device, and may be readily scaled to meet industry specification requirements (e.g., JEDEC and IEC/ISO specs). The disclosed ESD protection device is optimized specifically for single or dual polarity protection to provide very high ESD performance (in terms of current capability, latch-up immunity, EMC immunity, etc.), low on-state resistance $R_{ON}$, and a very compact footprint.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

With advances in smart power technologies and requirements of ESD standards associated therewith (such as JEDEC and IEC/ISO 10605 standards), ESD designers confront increasingly narrow design windows which define the voltage range between a low limit (set by the protection latch-up to be smaller than the snapback voltage Vsb) and a high limit (set by the breakdown point Vt2 for the circuit being protected). As the design windows shrink, there are design tradeoffs between the on-state resistance $R_{ON}$, the tuning of the triggering threshold voltage Vt1 and snapback voltage Vsb for the ESD clamp, and the size of the ESD clamp. These design tradeoffs between size, robustness, and functionality can be exacerbated with ESD clamp circuits that are designed to protect against both positive and negative voltage fluctuations. For example, it is desirable to keep the on-state resistance $R_{ON}$ low so that the on-state voltage stretch-out does not lead to the degradation of the protected circuit, while the triggering threshold voltage Vt1 and snapback voltage Vsb must be tuned to activate the ESD clamp under relatively high voltage conditions that effectively increase the on-resistance, which is undesirable. In many cases, the only way to get a low enough on-state resistance $R_{ON}$ is to increase the size of the ESD protection circuit, thereby increasing chip cost. However, the problem of increased circuit size is multiplied with designs where each pin has a dedicated ESD clamp, and the trend in increasing the number of pins on a chip results in a substantial part of the die is taken by ESD clamps. The consumption of die area is a more serious concern for system-level pins, which use large ESD clamps.

FIG. 1 shows a simplified circuit schematic diagram illustrating an ESD protection circuit configuration 100 for protecting a plurality of I/O pins (e.g., Pin 10, Pin 20) such that each pin is protected by a separate ESD clamp formed with a dedicated stack of ESD protection devices or NPN stacks. In particular, the first pin 10 is connected to a 40V ESD clamp formed by stacking a top NPN stack 18 and a bottom NPN stack 19. The top NPN stack 18 includes a top stage NPN bipolar junction transistor (BJT) 11 and low stage BJT 12 connected in series between the first pin 10 and the bottom NPN stack 19 so that the BJT devices 11-12 share a common collector which is connected across a substrate diode 13 to a reference voltage 17 (e.g., ground). In particular, the base and emitter of the top stage BJT 11 are electrically connected to the first pin 10, and the base and emitter of the low stage BJT 12 are electrically connected to the bottom NPN stack 19. Similarly, the bottom NPN stack 19 includes a top stage NPN BJT 14 and low stage BJT 15 connected in series between the top NPN stack 18 and the reference voltage 17 (e.g., ground) such that the common collector of the BJT devices 14-15 is connected across a substrate diode 16 to the reference voltage 17 (e.g., ground). As described more fully hereinbelow, the lateral base-collector spacing dimensions for the BJTs 11-12, 14-15 are controlled to provide the desired triggering threshold voltage Vt1 value. In this context, a base-collector spacing dimension is determined by the lateral separation between the p-well region forming the base, and the n-region forming the collector. In the top NPN stack 18, the spacing dimension of the top stage BJT 11 (e.g., Sp=1.54) provides a first desired triggering threshold voltage Vt1 value, and the spacing dimension of the low stage BJT 12 (e.g., Sp=0.9) provides a second desired triggering threshold voltage Vt1 value. And in the bottom NPN stack 19, the spacing dimension of the top stage BJT 14 (e.g., Sp=3.0) provides a third desired triggering threshold voltage Vt1 value, and the spacing dimension of the low stage BJT 15 (e.g., Sp=0.0) provides a fourth desired triggering threshold voltage Vt1 value. In this way, the ESD clamp 18-19 for the first pin 10 is rated as +/−40V under normal operation.

As shown in FIG. 1, the second pin 20 has its own dedicated 40V ESD clamp formed by stacking a top NPN stack 28 and a bottom NPN stack 29 between the second pin 20 and the reference voltage 27 (e.g., ground). Similar to the ESD clamp for the first pin, each NPN stack 28, 29 includes a top stage NPN BJT 21, 24 and low stage BJT 22, connected, respectively, in series so that the BJT devices 21-22, 24-25 share a common collector which is connected across a substrate diode 23, 26 to a reference voltage 27. In particular, the base and emitter of the top stage BJT 21 in the top NPN stack 28 are electrically connected to the second pin 20, while the base and emitter of the low stage BJT 22 in the top NPN stack 28 are electrically connected to the bottom NPN stack 29. Similarly, the bottom NPN stack 29 includes a top stage NPN BJT 24 and low stage BJT 25 connected in series between the top NPN stack 28 and the reference voltage 27. As with the ESD clamp for the first pin, the lateral base-collector spacing dimensions for the BJTs 21-22, 24-25 are controlled to provide the desired DC BV/Vt1 characteristic values. By appropriate controlling the lateral base-collector spacing dimensions, the ESD clamp 28-29 for the second pin 20 is rated as +/−40V under normal operation.

While each of the dedicated ESD clamps (e.g., 18-19) has very high ESD robustness and low on-state resistance $R_{ON}$, the provision of separate, dedicated ESD clamps to protect each pins (e.g., pin 10 and pin 20) uses a substantial part of a die or circuit area to provide the footprint for the separate, dedicated ESD clamps. This may be understood with reference to the ESD protection circuit configuration 100 shown in FIG. 1 where each of the NPN stacks 18, 19, 28, 29 is formed with a top stage BJT device (e.g., 11) and a low stage BJT device (e.g., 12) to provide protection against single or dual polarity ESD voltage events. When fabricated, the top stage BJT may be formed in an n-type semiconductor region (acting as a shared NPN transistor collector) which is formed on a grounded p-type substrate (to thereby form a substrate diode with the n-type semiconductor region), and which includes a first p-type region or well in which is separately formed a p-type region or well (acting as a NPN transistor base) and an n-type region or well (acting as the NPN transistor emitter), where the p-type and n-type regions in the top stage are electrically connected together (e.g., to a protected pin or another NPN-based device). The low stage BJT may be separately formed in the n-type semiconductor region or well (acting as the shared NPN transistor collector) which includes a p-type region or well in which is separately formed a p-type region (acting as a NPN base) and an n-type region (acting as NPN transistor emitter), where the p-type and n-type regions in the low stage are electrically connected together (e.g., to a reference voltage or another NPN-based device). With the NPN stacks 18 and 19 are connected in series via metal layer conductors between the first pin 10 and ground 17, and the NPN stacks 28 and 29 are connected in series via metal layer conductors between the second pin 20 and ground 27, a significant amount of circuit area is consumed since four separate NPN stacks are used in forming the ESD protection circuit configuration 100.

To reduce the ESD clamp footprint without reducing ESD robustness and functionality, there is disclosed herein a compact configuration of stacked BJT clamps for protecting a plurality of pins connected to the same reference voltage (e.g., ground) by sharing one or more NPN-based ESD protection devices. With the compact configuration ESD protection device disclosed herein, targeted ESD protection parameters (e.g., Vt1, DC BV, Vhold) are maintained with a reduced footprint. To illustrated selected embodiments of the compact configuration of stacked BJT clamps for protecting a plurality of pins, reference is now made to FIG. 2 which shows a simplified circuit schematic diagram 200 illustrating a pair of pins 30, 40 protected by a pair of ESD clamps which share a bottom stack ESD protection device to obtain dual polarity ESD protection having low on-resistance, reduced footprint, and uncompromised ESD performance. As depicted, the first I/O pin 30 is coupled to a reference voltage 37 (e.g., ground) across a +/−40V ESD clamp which includes a first top NPN stack 38 connected in series with a common bottom NPN stack 39. In addition, the second I/O pin 40 is coupled to the reference voltage 37 across a +/−40V ESD clamp which includes a second top NPN stack 48 connected in series with the common bottom NPN stack 39. The first top NPN stack 38 includes a top stage NPN BJT 31 and low stage BJT 32 connected in series between the first pin 30 and the common bottom NPN stack 39 so that the BJT devices 31-32 share a common collector which is connected across a substrate diode 33 to the reference voltage 37. In particular, the base and emitter of the top stage BJT 31 are electrically connected to the first pin 30, and the base and emitter of the low stage BJT 32 are electrically connected to the common bottom NPN stack 39. Similarly, the second top NPN stack 48 includes a top stage NPN BJT 41 and low stage BJT 42 connected in series between the second pin 40 and the common bottom NPN stack 39 so that the BJT devices 41-42 share a common collector which is connected across a substrate diode 43 to the reference voltage 37. In particular, the base and emitter of the top stage BJT 41 are electrically connected to the second pin 40, and the base and emitter of the low stage BJT 42 are electrically connected to the common bottom NPN stack 39. Finally, the common bottom NPN stack 39 includes a top stage NPN BJT 34 and low stage BJT 35 connected in series between the emitters of the top NPN stacks 38, 48 and the reference voltage 37 such that the common collector of the BJT devices 34-35 is connected across a substrate diode 36 to the reference voltage 37. By connecting the pair of pins 30, 40 to first and second top stack NPN-based ESD devices 38, 48 which, in turn, are both connected to a common bottom NPN-based ESD device 39, the pins 30, 40 are protected against ESD events with a reduced number of NPN stacks.

The stacking of NPN-based ESD protection devices to use a shared or common bottom NPN-based ESD device is possible because the basic NPN-based ESD device has saturation region in which Vt1/DC BV is non-sensitive to overlay, and also has a non-saturation region in which Vt1/DC BV is controllable by lateral base-collector spacing dimension. Thus, depending on the lateral base-collector spacing dimension in the top and low stages, the NPN-based ESD device may be programmed or controlled to any desired protection level. For example, the low stage BJT 35 in the common bottom NPN-based ESD device 39 may be formed with a spacing dimension in the saturation region (Sp=0 um) while the overall DC BV/Vt1 for the NPN-based ESD device 39 is controlled by the spacing dimension of the top stage BJT 34 (e.g., Sp=3 um). With this configuration, a forward-biased ESD event received at the NPN-based ESD device 39 results in the top stage BJT 34 performing as a diode, and the low stage BJT 35 contributing a Vt1=17.25V (based on the spacing dimension Sp=0 um). Conversely, a reverse-biased ESD event received at the NPN-based ESD device 39 results in the common bottom NPN-based ESD device 39 being bypassed by the sub-diode 36.

Figure 2:
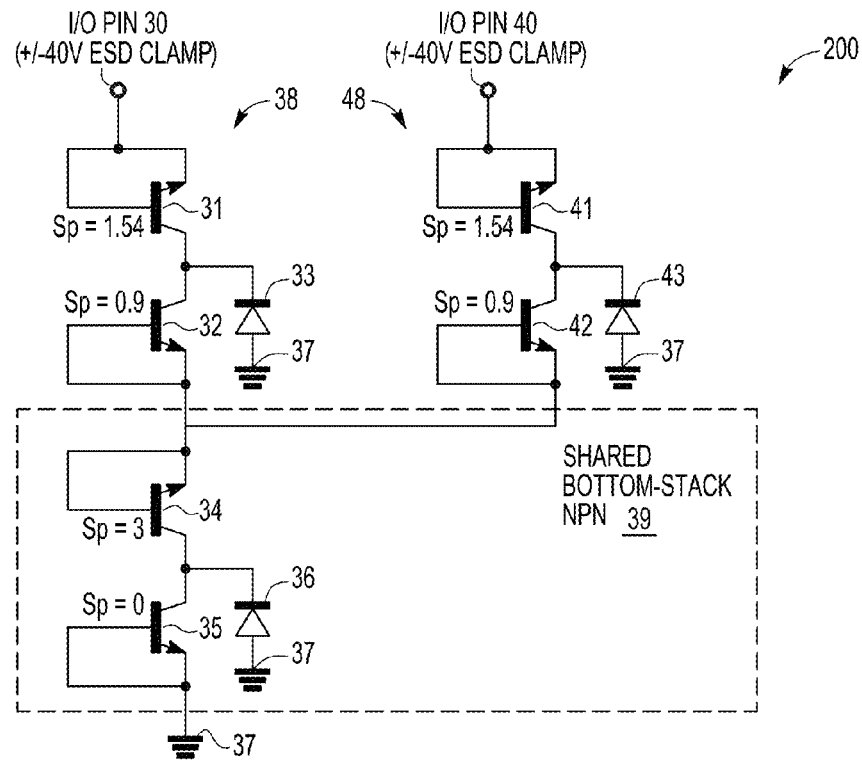
FIG. 2 shows a simplified circuit schematic diagram illustrating a pair of pins protected by a pair of ESD clamps which share a bottom stack ESD protection device.

To illustrate how the lateral base-collector spacing dimensions for the BJTs 31-32, 34-35, 41-42 may be separately controlled to provide the desired triggering threshold voltage Vt1 values for each ESD clamp circuit, FIG. 2 shows that the top stage BJTs 31, 41 in the top NPN stacks 38, 48 have a predetermined spacing dimension of (e.g., Sp=1.54) to provide a first desired triggering voltage Vt1 value, and the low stage BJTs 32, 42 have a predetermined spacing dimension (e.g., Sp=0.9) to provide a second desired triggering voltage Vt1 value. And in the shared bottom NPN stack 39, the spacing dimension of the top stage BJT 34 (e.g., Sp=3.0) provides a diode drop, and the spacing dimension of the low stage BJT 35 (e.g., Sp=0.0) provides a fourth desired triggering voltage Vt1 value. In the event of a forward-biased ESD strike at I/O pin 30, the top stage BJT 31 (Sp=1.54) acts as a diode, the low stage BJT 32 (Sp=0.9) provides approximately +33V of Vt1 protection, the top stage BJT 34 (Sp=3.0) acts as a diode, and the low stage BJT 35 (Sp=0.0) provides approximately +17.25V of Vt1 protection, for a total of approximately +50.25V of Vt1 protection. And in the event of a reverse-biased ESD strike at I/O pin 30, the top stage BJT 31 (Sp=1.54) provides approximately −47V of Vt1 protection, while the low stage BJT 32 (Sp=0.9) and common bottom NPN stack 39 are effectively bypassed due to substrate diode, for a total of approximately −47V of BV protection. As will be appreciated, a forward or reverse-biased ESD strike at I/O pin 40 will be handled in the same way by the BJTs in the top NPN stack 48 and bottom NPN stack 39. In this way, both of the pins 30, 40 are provided with dual polarity ESD protection by sharing the common bottom NPN stack 39, thereby reducing the total number of NPN stacks from four to three to provide a 25% deduction in foot print.

To confirm the operability of using shared NPN stacks, transmission-line pulse (TLP) ESD testing for both forward and reverse bias ESD events has been performed to show that clamps with shared stacks (such as shown in FIG. 2) maintain the same targeted performance parameters (e.g., Vt1, Vsb) and ESD robustness as clamps which use separate, dedicated stacks (such as shown in FIG. 1).

Figure 3:
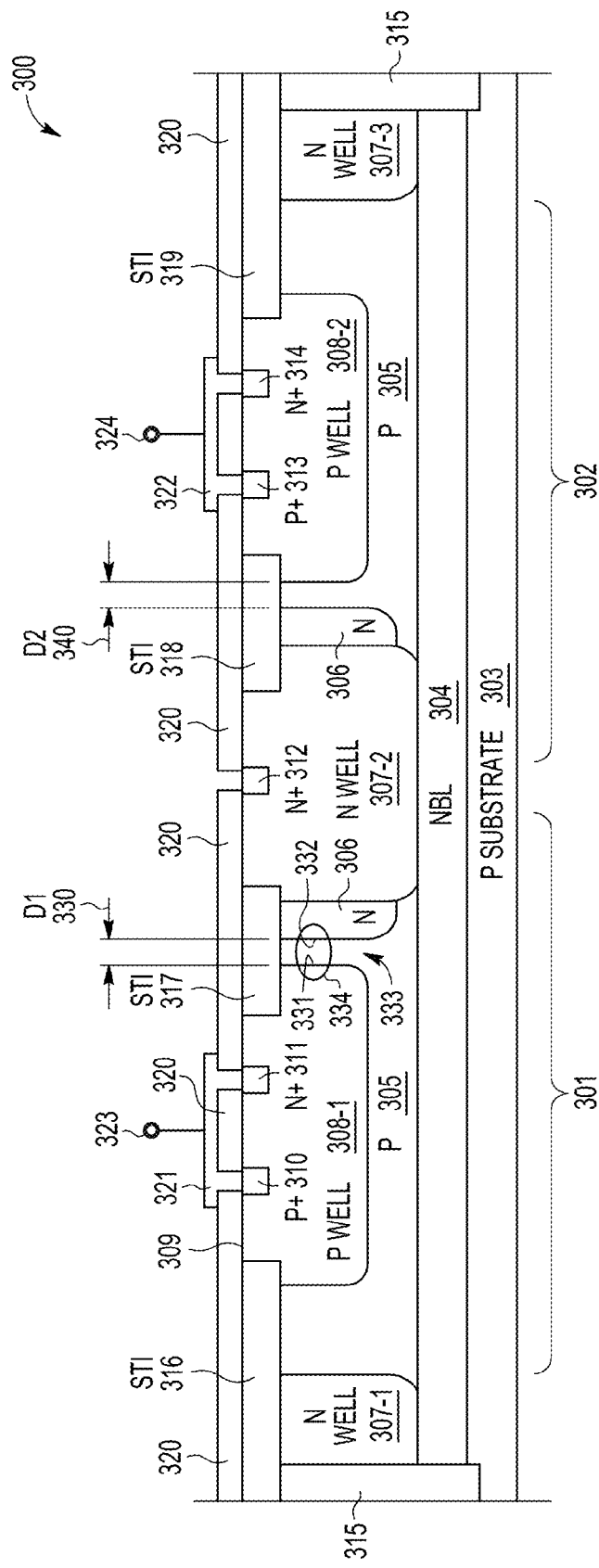
FIG. 3 shows a partial cross-sectional view of an NPN stack with separately tunable top and bottom stages which may be used to form an ESD protection device.

To further illustrated selected embodiments, reference is now made to FIG. 3 which depicts a partial cross-sectional view of an NPN stack 300 fabricated in a substrate using BiCMOS process technology with separately tunable top stage 301 and low stage 302 which may be used to form a top or bottom stack in a dual polarity ESD protection device as disclosed herein. In the top stage 301, the n+ region 311, p-base 308-1, and n-well 307-2 form the emitter, base, and common collector regions, respectively, of a first NPN bipolar transistor. In similar fashion, the low stage 302 includes the n+ region 314, p-base 308-2, and n-well 307-2 which together form the emitter, base and common collector regions, respectively, of a second NPN bipolar transistor. There are also other BJT, resistor, and diode devices (not shown) formed by the different materials and applicable polarity of the voltage or current pulse. Though the various structures, well, and layer regions are illustrated in simplified form with straight lines and corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. The depicted NPN stack 300 is formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

As depicted, the NPN stack 300 may be formed on or as part of a semiconductor substrate formed of a material having first conductivity type impurities, such as a p-type substrate layer 303, at a predetermined P doping level (e.g., approximately 1E18 to 5E18 cm$^{-3}$), though any desired dopant type and/or concentration may be used. As will be appreciated, the substrate 303 may be formed as a bulk semiconductor substrate or a semiconductor-on-insulator (SOI) type substrate in which one or more additional semiconductor layers and/or well regions are formed using epitaxial semiconductor growth and/or selective doping techniques as described more fully hereinbelow. Thus, there is no specific substrate type required. And depending on the type of device being fabricated, the semiconductor substrate 303 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof, alone or in combination with an epitaxial layer 305 (e.g., p-type epi layer). However formed, the substrate 303, alone or in combination with any additional layers or regions formed therein, has an upper surface 309 defining the uppermost extent of the substrate.

In the substrate 303/305, an isolation structure may be formed which includes an N+ buried layer 304 and a plurality of n-type sinker wells 307. The n-type sinker well(s) 307 may be formed by using a mask to selectively diffuse or implant n-type impurities into the substrate to a predetermined implant energy and dopant concentration (e.g., 1E16 to 1E19 cm$^{-3}$) so as to be located in an upper portion of the substrate 303/305 and at a sufficient depth to reach the N+ buried layer 304. In selected embodiments, the n-type sinker wells include one or more isolation wells 307-1, 307-3 located at the periphery of the NPN stack 300, as well as a central n-type sinker well 307-2 which separates the NPN stack 300 to define low stage 301 and top stage 302 portions and provides at least part of a common collector region therebetween. As for the N+ buried layer 304, a different mask and/or implant sequence is used to selectively implant n-type impurities (e.g., Antimony) into the substrate 303/305 to a predetermined implant energy and dopant concentration (e.g., 1E18 to 1E20 cm$^{-3}$) so as to overlap with the n-type sinker well(s) 307 and below the subsequently-formed p-well regions 308. As depicted, the floating isolation structure 304/307 is not directly connected to any reference potential, and separately surrounds and isolates both the low stage 301 and the top stage 302 during normal operation of the NPN stack 300. As will be appreciated, the N+ buried layer 304 may be a buried layer, epitaxial layer or any N-type layer formed in any manner. N+ sinker wells 307 may be implemented as a conductive sinker or in any desired manner, and in combination with N+ buried layer 304, forms an isolation tub or feature which may be used to conductively isolate the NPN stack 300 from the rest of the integrated circuit. Additional isolation is provided by forming deep trench insulator regions 315 around the ESD protection area in the substrate 303/305 using any desired technique for etching and filling deep trench openings with one or more dielectric materials.

Above the buried layer 304, one or more semiconductor layers 305 are formed to a predetermined thickness of a material having the first conductivity type (e.g., p-type) impurities. For example, the p-type semiconductor layer(s) 305 may be formed by implanting p-type impurities into an existing semiconductor substrate layer or by growing an epitaxial p-type layer having a thickness in the range of approximately 1.5-5 um with a p-type doping concentration (e.g., approximately 1E14 to 1E16 cm$^{-3}$, and more preferably 1E15 cm$^{-3}$), though other dopant types, thicknesses, and/or concentrations may be used. However formed, the doping concentration and/or epitaxial growth conditions are selected and controlled to form the p-type semiconductor layer 305 as a lightly doped p-type layer for the subsequently-formed n-well 306, deep n-well 307, and p-well 308 regions. At this stage of the process, the epitaxial p-type layer 305 may be formed over the entirety of the N+ buried layer 304 using any desired epitaxial process for growing or depositing a p-type semiconductor layer to the desired thickness and doping concentration.

In the p-type semiconductor layer 305, first and second low voltage well regions 308-1, 308-2 are formed to a predetermined depth of a material having the first conductivity type (e.g., p-type) impurities so as to be located to surround and contain each subsequently-formed terminal contact regions 310-311, 313-314. For example, the first and second well regions 308-1, 308-2 may be formed as deep p-type diffusions by using a mask or other technique to selectively diffuse or implant p-type impurities using a predetermined implant energy and dopant concentration (e.g., 1E16 to 1E19 cm$^{-3}$, and more preferably 5E16 to 5E18 cm$^{-3}$, and more preferably 1E17 cm$^{-3}$) to a predetermined depth (e.g., 1-1.5 um), though other dopant types, depths, and/or concentrations may be used. First and second low voltage well regions 308-1, 308-2 are generally somewhat more heavily doped than p-type semiconductor layer 305. However formed, the doping concentration, implant energy, and junction depth are selected and controlled to form the p-well regions 308-1, 308-2 so that they are completely contained within the p-type semiconductor layer 305 and separately from the n-well 306 and deep n-well 307 regions.

A central collector well region 306 is also formed in the p-type semiconductor layer 305 to a predetermined depth of a material having the second conductivity type (e.g., n-type) impurities so as to be located in ohmic contact with the central N-well 307-2 and spaced apart from the first and second p-well regions 308-1, 308-2 by, respectively first and second lateral spacing dimensions, D1, D2. For example, the central collector well region 306 may be formed as a deep n-type diffusion by using a mask or other technique to selectively diffuse or implant n-type impurities into the substrate 303/305 to a predetermined depth (e.g., about 0.2 to 3 microns, and more preferably at substantially the same depth as the first p-well region 308-1) using a predetermined implant energy and dopant concentration (e.g., 5E15 to 2E18 cm$^{-3}$, and more preferably 5E16 to 5E17 cm$^{-3}$), though other dopant types, thicknesses, and/or concentrations may be used. In forming the central collector well region 306, the patterned mask opening, doping concentration, implant energy, and junction depth are selected and controlled so that the central collector well region 306 is formed next to, but spaced apart from, the first p-well region 308-1 to thereby define a first lateral base-collector spacing dimension D1 330 between the boundary 331 of p-well (base) region 308-1 and the adjacent boundary 332 of the central collector well region 306. In other words, the first lateral base-collector spacing dimension D1 330 is determined by the lateral separation between the first p-well region 308-1 forming the base, and the n-type collector well region 306. As depicted, the base-collector spacing dimension D1 330 controls the avalanche breakdown region 334 which spans the portion 333 of the p-type semiconductor layer 305 between boundaries 331-332. In this way, the threshold voltage value is controlled by the avalanche breakdown between the p-well 308-1 and central collector well region 306, and can be adjusted by the distance D2 330 between these wells 308-1 and 306.

In similar fashion, the formation and placement of the central collector well region 306 is controlled to be spaced apart from the second p-well region 308-2 to thereby define a second lateral base-collector spacing dimension D2 340 between the boundary of p-well (base) region 308-2 and the adjacent boundary of the central collector well region 306. Again, the base-collector spacing dimension D2 340 may be used to adjustably control the avalanche breakdown region 334 in the p-type semiconductor layer 305 between boundaries of the second p-well region 308-2 and the central collector well region 306.

After forming the p-well and n-well regions 306-308, a plurality of separate implant mask and implantation processes are used to form the contact region(s) 310-314, including forward base P+ region 310, forward emitter N+ region 311, common collector region 312, reverse base P+ region 313, and reverse emitter N+ region 314. For example, the n+ contact regions 311, 314 may be formed by using an implant mask (not shown) to selectively implant n-type impurities into the first and second low voltage p-well regions 308-1 and 308-2 to a predetermined thickness (e.g., about 0.1-0.3 microns) using a predetermined implant energy and dopant concentration (e.g., 1E19-1E21 cm$^{-3}$), though other dopant types, thicknesses, and/or concentrations may be used. In similar fashion, the p+ contact regions 310, 313 may be formed by using an implant mask (not shown) to selectively implant p-type impurities into the first and second low voltage p-well regions 308-1 and 308-2 to a predetermined thickness (e.g., about 0.1-0.3 microns) using a predetermined implant energy and dopant concentration (e.g., 1E19-1E21 cm$^{-3}$), though other dopant types, thicknesses, and/or concentrations may be used.

Shallow trench isolation (STI) regions 316-319 may be formed in an upper portion of the substrate 303/305 to surround and isolate the various well regions in the NPN stack 300. The STI regions 316-319 may be formed by selectively etching trench openings in the substrate 303/305 using an etch mask, filling the openings with appropriate isolation material(s), and then polishing or planarizing the isolation material(s) isolation down to the surface of the substrate 303/305. Though illustrated as STI regions, it will be appreciated that field oxide regions may also be used, or any other desired dielectric material which forms an electrical isolation barrier for electrically isolating the NPN stack 300 from the rest of the integrated circuit.

During back-end processing, one or more metallization layer(s) 321-322 are formed to connect the NPN stack 300 to external circuitry with the forward base P+ region 310 and forward emitter N+ region 311 connected together to a first node 323, and the reverse base P+ region 313 and reverse emitter N+ region 314 connected to a second node 324. For example, after forming the contact region(s) 310-314, a dielectric or masking layer 320 is deposited, patterned and selectively etched to define openings over the contact regions 310-314. With the contact regions 310-314 exposed, a conductive layer is deposited, masked and selectively etched to form first and second conductors 321, 322. The first conductor 321 is formed to make ohmic contact to the n+ and p+ contact regions 310, 311 in the top stage 301 for connection to a first connection terminal 323. The same processing steps may be used to form the second conductor 322 in ohmic contact to the p+ contact region 313 and n+ contact region 314 in the low stage 302 for connection to a second connection terminal 324.

As indicated above, the lateral base-collector spacing dimensions, D1, D2, for the top and low stage BJT devices may be controlled or dialed in to build ESD devices that have different Vt1 values to meet the protection needs of different circuits. To assist in the design of the desired triggering voltage Vt1 value for each BJT device, reference is now made to FIG. 4 which shows a simplified plot 400 transient breakdown voltage Vt1 (trace 404) and DC breakdown voltage DC BV (trace 403) in volts as a function of lateral base-collector triggering spacing dimension D in micrometers for a single-stack NPN-based ESD protection device over an extended spacing range (−0.5 um<D<4 um). In this case, a single-stack NPN-based device may refer to an NPN-type BJT device having a lateral base-collector triggering spacing dimension D. As illustrated, the values of Vt1 (trace 404) and DC BV (trace 403) are close together and have substantially identical slopes ($\Delta Vt1/\Delta D$). Plots 403, 404 may be divided into a saturation zone 401 and a non-saturation zone 402, where the saturation region 401 corresponds to a lateral base-collector spacing dimension D at or below approximately 0.25 um, and where the non-saturation region 402 corresponds to a lateral base-collector spacing dimension D at or above approximately 0.25 um, though different values may be obtained in other embodiments. As depicted, Vt1 varies approximately linearly with spacing dimension D=0.25 to 1.5 um with slope ($\Delta Vt1/\Delta D$) for both transient and DC) of about 23-28 volts per micrometer. In addition, the slope ($\Delta Vt1/\Delta D$) above and below the linear range (e.g., D<0.25 um and D>1.5 um) is significantly smaller. For a variety of different reasons relating to process variation and device control, it may be desirable to choose lateral spacing dimensions from within the linear range (e.g., 25 um<D<1.5 um).

Figure 4:
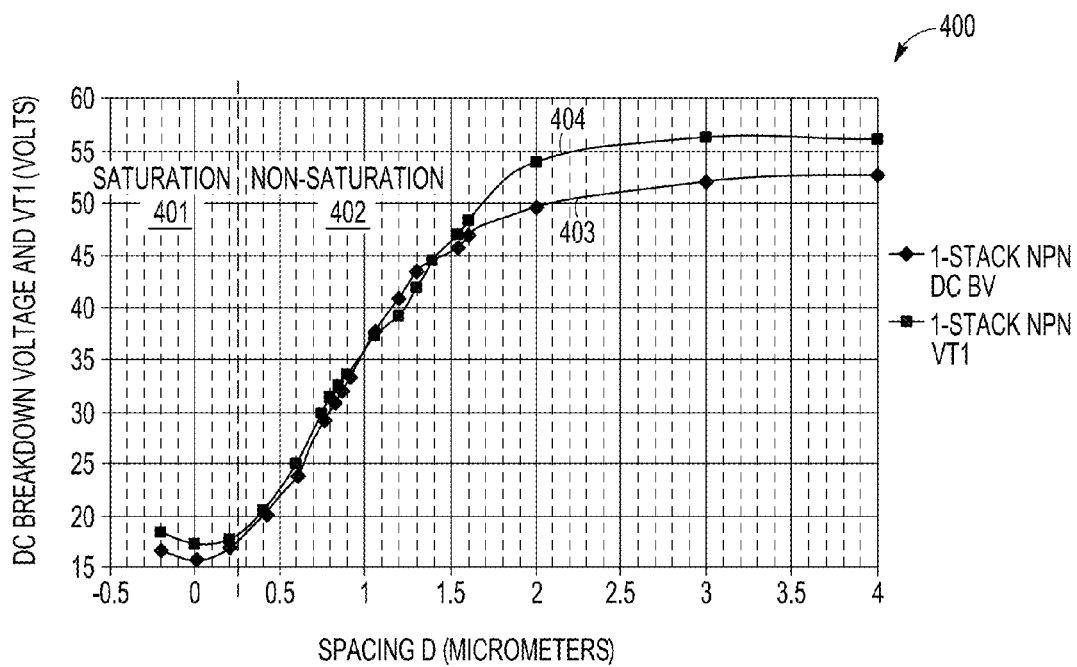
FIG. 4 is a simplified plot of DC breakdown voltage as a function of lateral base-collector triggering spacing dimension for a single-stack NPN-based ESD protection device.

Using the plot 400 shown in FIG. 4, the desired triggering threshold voltage Vt1 for an NPN-type BJT device in each NPN stack may be set by finding the desired triggering threshold voltage Vt1 on the trace 404, and then locating corresponding lateral spacing D on the x-axis which is used to dial in or control the lateral base-collector triggering spacing dimension for the NPN-type BJT device. In this way, the lateral spacing values D for each NPN-type BJT device in the combined stack may be used to provide the desired overall ESD protection for each I/O pin.

As will be appreciated, the ESD protection device which stacks a pair of top NPN stacks to share a bottom NPN stack device operates to provide single or dual-polarity ESD protection for a pair of I/O pins against both positive and negative voltage or current pulses, and the range of protection can be extended (e.g., from 10V to 80V), depending on the lateral base-collector triggering spacing used for the constituent NPN-type BJT devices. By appropriately controlling the spacing dimension D and stacking the NPN BJT devices in series to include one or more shared bottom NPN stack devices, the targeted Vsb and triggering voltage Vt1 can be reached for each protected pin. In addition, the stacking arrangement permits different snapback voltage Vsb and triggering voltage Vt1 target values to be achieved for different pins sharing the bottom NPN stack device(s). As a result, multiple pins can be provided with different levels of ESD protection using a reduced footprint while meeting performance for high voltage clamps specified by various industry-standard ESD models (such as human-body model (HBM), machine model (MM), and charged device model (CDM) specifications), all without requiring any additional circuit components.

Figure 5A:
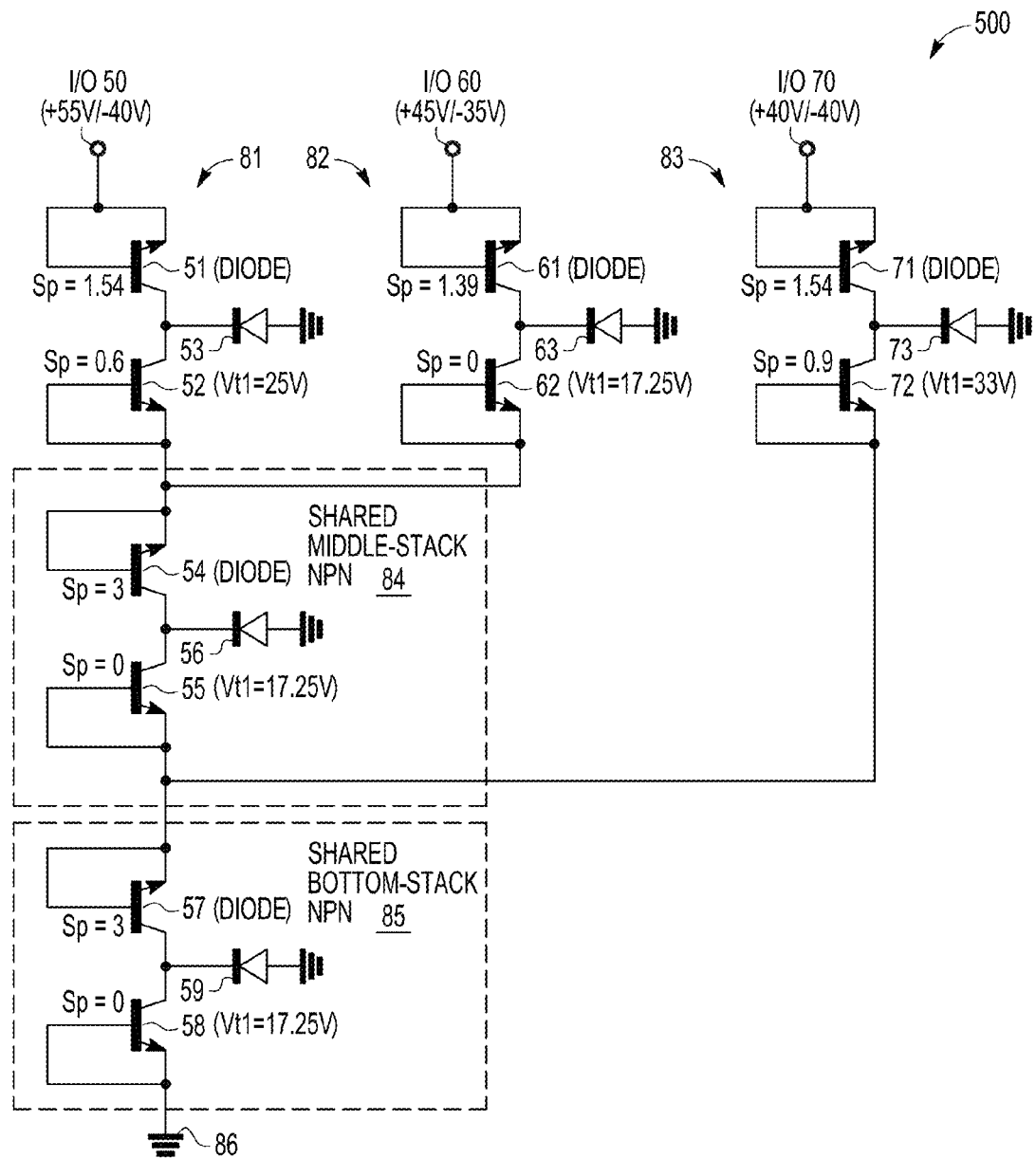
FIG. 5(a) shows a simplified circuit schematic diagram illustrating a plurality of pins protected by a plurality of ESD clamps which share one or more stacks of ESD protection devices under a forward ESD transient event.
Figure 5B:
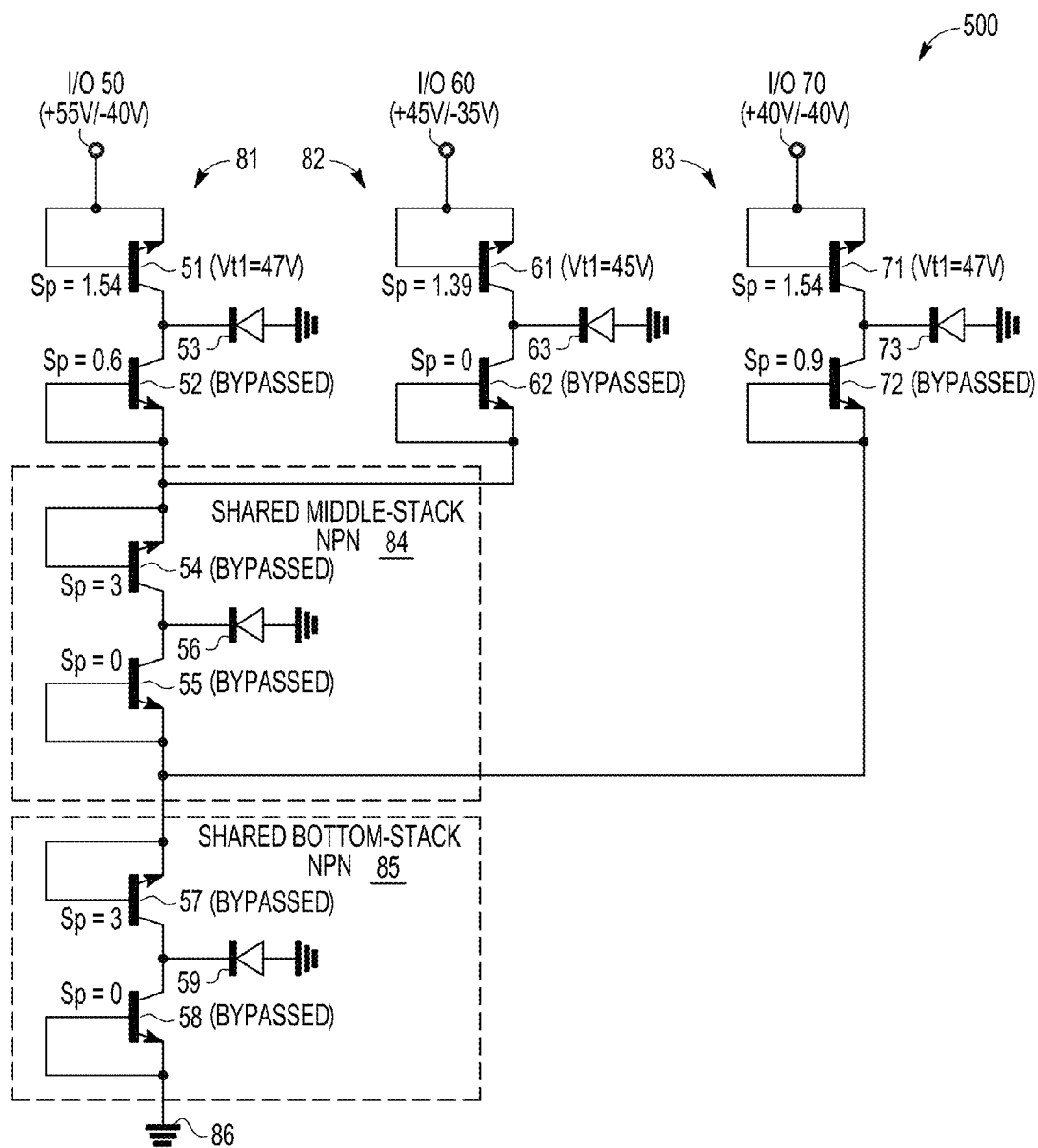
FIG. 5(b) shows a simplified circuit schematic diagram illustrating a plurality of pins protected by a plurality of ESD clamps which share one or more stacks of ESD protection devices under a reverse ESD transient event.

An example to show how NPN stacks can be shared with multiple pins to provide different tiers of voltage protection is shown in FIGS. 5(a)-(b) which depict a simplified circuit schematic diagram illustrating a plurality of pins 50, 60, 70 protected by a plurality of stacked ESD clamps 500 which share one or more NPN stacks. In FIG. 5(a), the NPN trigger values for the stacked ESD clamps 500 are illustrated to show how they add up to the total voltage level Vt1 of protection under forward-biased ESD transient events. And FIG. 5(b), the same stacked ESD clamps 500 are shown, but now with the NPN trigger values which add up to the total voltage level Vt1 of protection under reverse-biased ESD transient events. In a conventional ESD protection scheme, three pins might conventionally require eight separate NPN stacks to provide ESD protection, while the depicted circuit 500 shows that the three pins can be protected with five NPN stacks when at least one of the NPN stacks is shared, providing a 38% deduction in foot print.

In the illustrated ESD clamp stack 500, a first I/O pin 50 is coupled across a first clamp to a common reference voltage 86 (e.g., ground), where the first clamp provides +55/−40V ESD protection across a series-connected first top NPN stack 81, a shared middle NPN stack 84, and a shared bottom NPN stack 85. In the first top NPN stack 81, a top stage NPN BJT 51 and low stage BJT 52 are connected in series between the first pin 50 and the shared middle NPN stack 84 as shown so that the BJT devices 51-52 share a common collector which is connected across a substrate diode 53 to the reference voltage 86. In addition, the spacing dimensions of the top stage BJT 51 (e.g., Sp=1.54) and low stage BJT 52 (e.g., Sp=0.6) combine to provide a first desired triggering threshold voltage Vt1 value, depending on the polarity of the ESD transient event. In the shared middle NPN stack 84, the top stage NPN BJT 54 and low stage BJT 55 are connected in series as shown to share a common collector which is connected across a substrate diode 56 to the reference voltage, where the spacing dimensions of the top stage BJT 54 (e.g., Sp=3.0) and low stage BJT 55 (e.g., Sp=0.0) provide a desired triggering threshold voltage Vt1 value, again depending on the polarity of the ESD transient event. Finally, the shared bottom NPN stack 85 includes a top stage NPN BJT 57 and low stage BJT 58 connected in series between the shared middle NPN stack 84 and the reference voltage as shown so that the BJT devices 57-58 share a common collector which is connected across a substrate diode 59 to the reference voltage. In addition, the spacing dimensions of the top stage BJT 57 (e.g., Sp=3.0) and low stage BJT 58 (e.g., Sp=0.0) provide a desired triggering threshold voltage Vt1 value.

By virtue of stacking the stacks 81, 84, 85 in series, the first clamp provides a total combined triggering threshold voltage Vt1 value for forward and reverse bias ESD events at the +55/−40V pin 50. In the case of the forward bias events between the first I/O pin 50 and ground 86, FIG. 5(a) shows that the top NPN stack 81 contributes a Vt1=25V (from the top stage BJT 51 (Sp=1.54) acting as a diode and the low stage BJT 52 (Sp=0.6) contributing Vt1=25V), the middle NPN stack 84 contributes a Vt1=17.25V (from the top stage BJT 54 (Sp=3) acting as a diode and the low stage BJT 55 (Sp=0) contributing Vt1=17.25V), and the bottom NPN stack 85 contributes a Vt1=17.25V (from the top stage BJT 57 (Sp=3) acting as a diode and the low stage BJT 58 (Sp=0) contributing Vt1=17.25V). As a result of combining the Vt1 values from each NPN stack, the total forward bias protection at the first I/O pin 50 is Vt1=25+17.25+17.25=59.5. In the case of the reverse bias events between the first I/O pin 50 and ground 86, FIG. 5(b) shows that the top NPN stack 81 contributes a Vt1=−47V (from the top stage BJT 51 (Sp=1.54) contributing Vt1=−47V and the low stage BJT 52 being bypassed by the substrate diode 53), while the middle NPN stack 84 and bottom stack 85 contribute nothing beyond the turn on voltage (e.g., 0.3V) of the substrate diodes 56, 59 which bypass the BJT devices 54-55 and 57-58. As a result of combining the Vt1 values from each NPN stack, the total reverse bias protection at the first I/O pin 50 is approximately −47V.

In similar fashion, the second +45/−35V I/O pin 60 is coupled across a second clamp to the common reference voltage 86 to obtain ESD protection using a series-connected second top NPN stack 82, the shared middle NPN stack 84, and shared bottom NPN stack 85, where the NPN stacks 84 and 85 are shared with the first ESD clamp provided for the first I/O pin 50. In the second top NPN stack 82, a top stage NPN BJT 61 and low stage BJT 62 are connected in series between the second pin 60 and the shared middle NPN stack 84 as shown so that the BJT devices 61-62 share a common collector which is connected across a substrate diode 63 to the reference voltage. However, the spacing dimensions of the top stage BJT 61 (e.g., Sp=1.39) and low stage BJT 62 (e.g., Sp=0.0) are selected to provide the desired triggering threshold voltage Vt1 value for the second top NPN stack 82. The design and performance of the shared middle NPN stack 84 and shared bottom NPN stack 85 are the same as described above.

By virtue of stacking the stacks 82, 84, 85 in series, the second clamp provides a total combined triggering threshold voltage Vt1 value for forward and reverse bias ESD events at the +45/−35 pin 60. In the case of the forward bias events between the second I/O pin 60 and ground 86, FIG. 5(a) shows that the top NPN stack 82 contributes a Vt1=17.25V (from the top stage BJT 61 (Sp=1.39) acting as a diode and the low stage BJT 62 (Sp=0) contributing Vt1=17.25V), while the shared middle NPN stack 84 and shared bottom NPN stack 85 each contribute a Vt1=17.25V as explained above. As a result of combining the Vt1 values from each NPN stack, the total forward bias protection at the second I/O pin 60 is Vt1=17.25+17.25+17.25=51.75. In the case of the reverse bias events between the second I/O pin 60 and ground 86, FIG. 5(b) shows that the top NPN stack 82 contributes a Vt1=−45V (from the top stage BJT 61 (Sp=1.39) contributing Vt1=−45V and the low stage BJT 62 being bypassed by the substrate diode 63), while the middle NPN stack 84 and bottom stack 85 contribute nothing beyond the turn on voltage (e.g., 0.3V) of the substrate diodes 56, 59. As a result of combining the Vt1 values from each NPN stack 82, 84, 85, the total reverse bias protection at the second I/O pin 60 is approximately −45V.

Lastly, the third +40/−40V I/O pin 70 is coupled across a third clamp to the common reference voltage 86 to obtain ESD protection across a third top NPN stack 83 and the shared bottom NPN stack 85 which are connected in series. In the third top NPN stack 83, a top stage NPN BJT 71 and low stage BJT 72 are connected in series between the third pin 70 and the shared bottom NPN stack 85 as shown so that the BJT devices 71-72 share a common collector which is connected across a substrate diode 73 to the reference voltage. However, the spacing dimensions of the top stage BJT 71 (e.g., Sp=1.54) and low stage BJT 72 (e.g., Sp=0.9) are selected to provide the desired triggering threshold voltage Vt1 value for the third top NPN stack 83, while the design and performance of the shared bottom NPN stack 85 is the same as described above By stacking the stacks 83, 85 in series, the third clamp provides a total combined triggering threshold voltage Vt1 value for forward and reverse bias ESD events at the +44/−40 pin 70. In the case of the forward bias events between the third I/O pin 70 and ground 86, FIG. 5(a) shows that the top NPN stack 83 contributes a Vt1=33V (from the top stage BJT 71 (Sp=1.54) acting as a diode and the low stage BJT 72 (Sp=0.9) contributing Vt1=33V), while the shared bottom NPN stack 85 contributes a Vt1=17.25V as explained above, for a total forward bias protection at the third I/O pin 70 is Vt1=33+17.25=50.25. In the case of the reverse bias events between the third I/O pin 70 and ground 86, FIG. 5(b) shows that the top NPN stack 83 contributes a Vt1=−47V (from the top stage BJT 71 (Sp=1.54) contributing Vt1=−47V and the low stage BJT 72 being bypassed by the substrate diode 73), while the bottom stack 85 contributes nothing beyond the turn on voltage (e.g., 0.3V) of the substrate diode 59 which bypasses the BJT devices 57-58. As a result of combining the Vt1 values from each NPN stack 83, 85, the total reverse bias protection at the third I/O pin 70 is approximately −47V.

Figure 6:
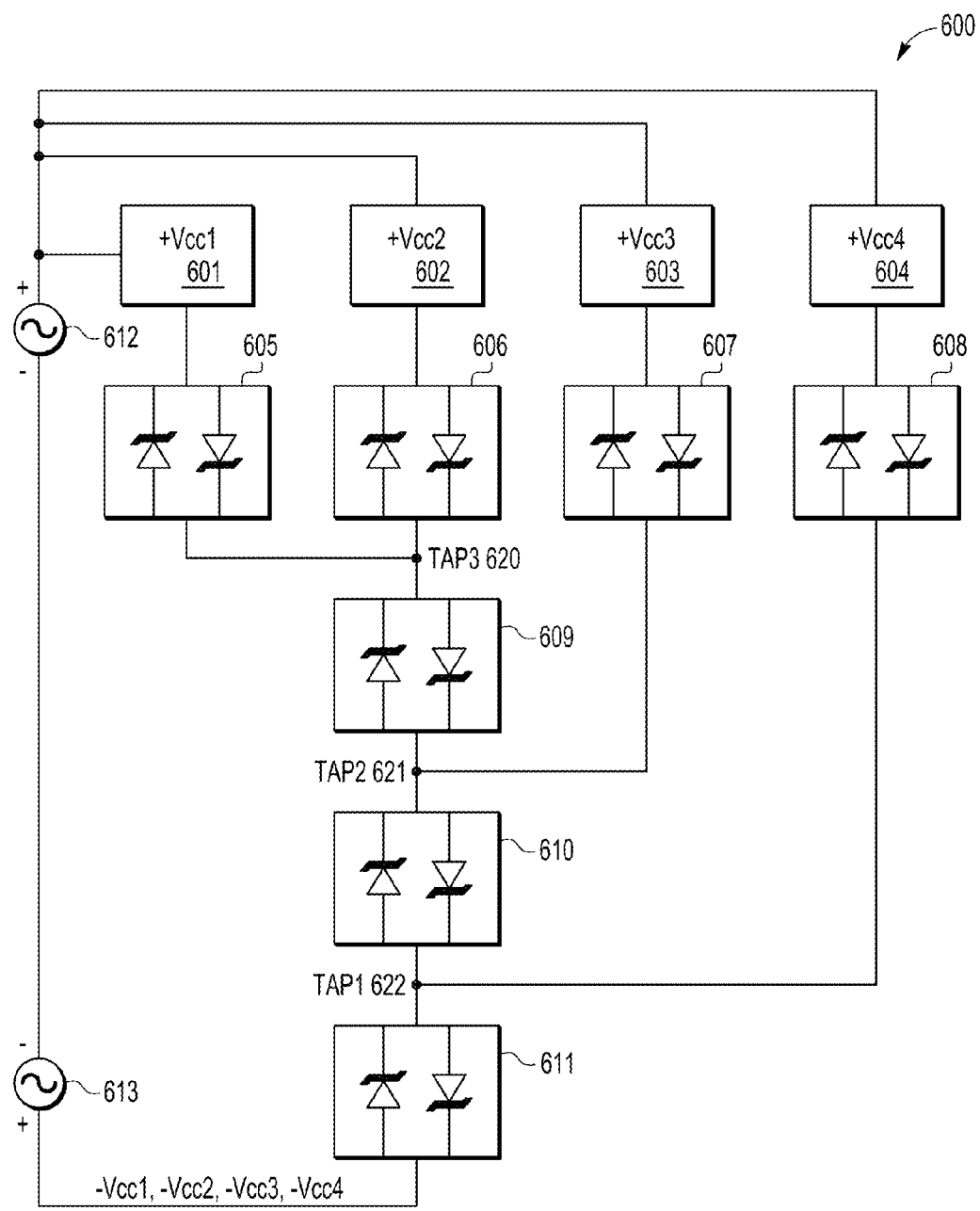
FIG. 6 shows a simplified circuit schematic diagram illustrating a plurality of pins protected by stacked ESD protection devices connected in a multi-tap configuration where each ESD protection device provides varying triggering voltages for both forward and reverse voltages.

Referring now to FIG. 6, there is shown a simplified circuit schematic diagram 600 illustrating another ESD protection circuit configuration for protecting a plurality of pins 601-604 with a plurality of stacked ESD protection devices 605-611. As depicted, the ESD protection devices 605-611 are connected in a multi-tap configuration where each ESD protection device provides a triggering voltage for protecting against both forward and reverse voltages (indicated by voltage supplies 612, 613). With the depicted configuration, one or more different taps 620-622 may be used to connect each pin into the series of dual polarity zener diode (DPZD) circuits so as to share a desired number of DPZD circuits for each pin. In this way, each tap can be used to provide different triggering voltage values Vt1 at pins 601-604 for both forward bias ESD voltages (indicated by voltage supply 612) and reverse bias ESD voltages (indicated by voltage supply 613). The tapping of the connections (tap1, tap2, tap3) may be implemented using metal routing or any other controllable switching technique to make an electrical connection to the stack of clamps at different stages.

In FIG. 6, each ESD protection device (e.g., 605) is represented as a dual polarity zener diode having a controllable breakdown voltage. In this sense, the dual polarity zener diode is functionally equivalent to an NPN stack having a breakdown voltage which may be controlled by the lateral base-collector triggering spacing used for the constituent NPN-type BJT devices. However, it will be appreciate that other separately configurable dual polarity zener diode structures may be used.

As shown in FIG. 6, the first pin 601 is coupled across a first clamp which provides ESD protection across a series-connected first top DPZD circuit 605, an upper shared DPZD circuit 609, a middle shared DPZD circuit 610, and a bottom shared DPZD circuit 611. As illustrated, the first top DPZD circuit 605 is connected into the series of DPZD circuits 606, 609-611 using a first tap connection 620 (tap 3). Since each of the DPZD circuits 605, 609, 610, 611 has a separately controllable breakdown voltage, the first clamp may be designed to effectively provide +/−Vcc1 of ESD protection to the first pin 601.

For the second pin 602, a second clamp provides ESD protection across a series-connected second top DPZD circuit 606, upper shared DPZD circuit 609, a middle shared DPZD circuit 610, and a bottom shared DPZD circuit 611. For the second clamp, no tap connection is required since the DPZD circuits 606, 609-611 are connected in series. By separately controlling the breakdown voltages of the DPZD circuits 606, 609-611, the second clamp may be designed to effectively provide +/−Vcc2 of ESD protection to the first pin 602.

The third pin 603 is coupled across a third clamp which provides ESD protection across a series-connected third top DPZD circuit 607, middle shared DPZD circuit 610, and bottom shared DPZD circuit 611. As illustrated, the third top DPZD circuit 607 is connected into the series of DPZD circuits 606, 609-611 using a second tap connection 621 (tap 2). Since each of the DPZD circuits 607 and 610-611 has a separately controllable breakdown voltage, the third clamp may be designed to effectively provide +/−Vcc3 of ESD protection to the third pin 603.

Lastly, the fourth pin 604 is coupled across a fourth clamp which provides ESD protection across a series-connected fourth top DPZD circuit 606 and bottom shared DPZD circuit 611. As illustrated, the fourth top DPZD circuit 608 is connected into the series of DPZD circuits 606, 609-611 using a third tap connection 622 (tap 1). Since each of the DPZD circuits 608 and 611 has a separately controllable breakdown voltage, the fourth clamp may be designed to effectively provide +/−Vcc4 of ESD protection to the fourth pin 604.

Figure 7:
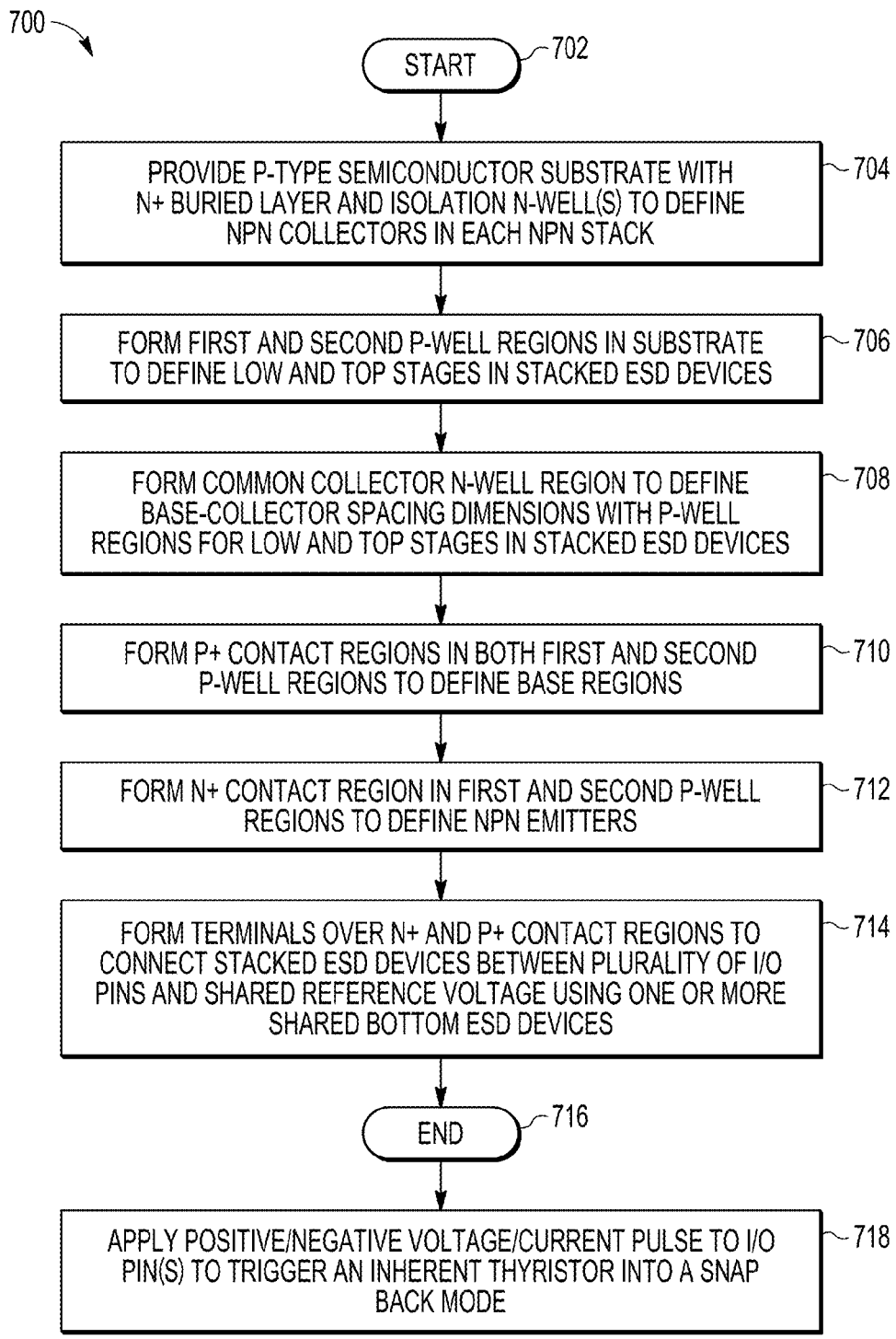
FIG. 7 is a simplified schematic flow chart illustrating various methods for fabricating and/or operating ESD protection devices in accordance with selected embodiments of the invention.

FIG. 7 is a simplified schematic flow chart illustrating various methods 700 for fabricating and/or operating ESD protection devices in accordance with selected embodiments of the invention. In describing the fabrication methodology 700, various reference numbers, doping types and concentrations are provided by way of examples of different regions that can be formed, but this is intended merely to facilitate understanding of various exemplary embodiments and not by way of limitation. Once the fabrication methodology starts (step 702), a semiconductor substrate layer is provided at step 704 which has a first conductivity type (e.g., p-type) and doping concentration (e.g., approximately 1E15 cm$^{-3}$). Unless otherwise indicated, subsequent steps may be provided in any desired order.

In the semiconductor substrate layer, an N+ buried layer and one or more N-wells are formed by selectively implanting and diffusing dopants having a second conductivity type (e.g., n-type) to define and isolate first and second p-type regions in the substrate and to define part of the common NPN collector regions for any NPN stacks (step 704). For example, the N+ buried layer may be formed by implanting and diffusing n-type dopants into the substrate to a predetermined implant energy and dopant concentration (e.g., 1E18 to 1E20 cm$^{-3}$). In addition, the N-wells may be formed by using a mask to selectively diffuse or implant n-type impurities into the substrate to a predetermined implant energy and dopant concentration (e.g., 1E16 to 1E19 cm$^{-3}$) so as extend from the surface of the substrate and down to intersect with the N+ buried layer. One of the N-wells is positioned to define part of the common collector region for an NPN stack and to separate the first and second p-type regions in the substrate which will define the low stage and top stage portions of the ESD protection device.

At step 706, first and second p-well regions are selectively formed in the substrate to define low stage and top stage portions of the ESD protection device that are separated by the isolation N-well. For example, the first and second p-well regions may be formed by using a mask to selectively diffuse or implant p-type impurities into the substrate using a predetermined implant energy and dopant concentration (e.g., 1E16 to 1E19 cm$^{-3}$) to a predetermined depth (e.g., 1.5 um). The first and second p-well regions are implanted into the low stage and top stage portions, respectively, of the ESD protection device At step 708, a common collector n-well region is selectively formed in the substrate to define the base-collector spacing which controls the breakdown between the common collector n-well region and the nearby low voltage p-well regions for both the low and top stages. This spacing is used to trigger the npn bipolar transistor in the low stage of the ESD protection device. For example, the common collector n-well region may be formed by using a mask to selectively diffuse or implant n-type impurities to a predetermined depth (e.g., about 0.2 to 3 um) using a predetermined implant energy and dopant concentration (e.g., in the range of approximately 5E15 to 2E18 cm$^{-3}$). At this stage, the lateral base-collector triggering spacing dimension may be used to separately control the breakdown voltages for the NPN BJT devices subsequently formed in the low and top stages of the ESD devices.

At step 710, the p+ contact regions are formed in the first and second p-well regions, such as by using a mask to selectively diffuse or implant p-type impurities to form shallow, highly doped p-type diffusion. The p+ contact regions are used to define in part the base regions in the NPN BJT devices subsequently formed in the low and top stages of the ESD devices. As will be appreciated, the p+ contact regions may be formed at the same time as the p-type source/drain regions are formed.

At step 712, the n+ contact regions are formed in the first and second p-well regions, such as by using a mask to selectively diffuse or implant n-type impurities to form shallow, highly doped n-type diffusions. The n+ contact regions are used to define in part the emitter regions in the NPN BJT devices subsequently formed in the low and top stages of the ESD devices. As will be appreciated, the n+ contact may be formed at the same time as the n-type source/drain regions are formed.

At step 714, one or more metallization or terminal electrode layers may be selectively formed over the n+ and p+ contact regions to connect the stacked ESD devices between a plurality of I/O pins and a shared reference voltage using one or more shared bottom ESD devices. As depicted, the fabrication methodology 700 ends at step 716, though it will be appreciated that additional front-end and back-end processing steps (not shown) may be performed.

After fabrication of the ESD protection device, the device is activated (step 718) to provide high voltage, bipolar-based ESD protection for multiple I/O pins against a single or dual polarity voltage or current pulse that is applied to any of the I/O pins. When an ESD voltage is applied across a protected I/O pin and the shared reference voltage, the device goes into operation by triggering an inherent thyristor into a snap-back mode that provides a low impedance path through the device for discharging the ESD current. Thus, the ESD protection device provides a compact solution for multiple stack clamp devices to shared at least one or more devices/stack to reduce footprint but without sacrificing performance.

By now it should be appreciated that there is provided herein an electrostatic discharge (ESD) protection circuit for a plurality of integrated circuit pins and method of operating same. As disclosed, the ESD protection circuit includes a first bipolar junction transistor (BJT) stack, a second BJT stack, and a third shared BJT stack. The first BJT stack is connected between a first integrated circuit pin and a first node, and includes a first plurality of bipolar transistors connected in series, each formed with a base-to-collector spacing dimension which provides a predetermined trigger voltage. In selected embodiments, the first BJT stack includes a first BJT having a first base region, first emitter region, and first collector region which is spaced apart from a first base region by a first base-to-collector spacing dimension which provides the first BJT with a first trigger voltage, where the first base region and first emitter region are connected to the first integrated circuit pin. The first BJT stack may also include a second BJT having a second base region, a second emitter region, and a second collector region which is spaced apart from the second base region by a second base-to-collector spacing dimension which provides the second BJT with a second trigger voltage, where the second base region and second emitter region are connected together to the first node. The second BJT stack is connected between a second integrated circuit pin and a second node, and includes a second plurality of bipolar transistors connected in series, each formed with a base-to-collector spacing dimension which provides a predetermined trigger voltage. In selected embodiments, the second BJT stack includes a third BJT having a third base region, a third emitter region, and a third collector region which is spaced apart from the third base region by a third base-to-collector spacing dimension which provides the third BJT with a third trigger voltage, where the third base region and third emitter region are connected to the second integrated circuit pin. The second BJT stack may also include a fourth BJT having a fourth base region, a fourth emitter region, and a fourth collector region which is spaced apart from the fourth base region by a fourth base-to-collector spacing dimension which provides the fourth BJT with a fourth trigger voltage, where the fourth base region and fourth emitter region are connected together to the second node. Finally, the third shared BJT stack is connected to the first and second BJT stacks (at the first and second nodes, respectively), is coupled to a shared reference voltage terminal, and includes a third plurality of bipolar transistors connected in series, each formed with a base-to-collector spacing dimension which provides a predetermined trigger voltage. In selected embodiments, the third shared BJT stack includes a fifth BJT having a fifth base region, a fifth emitter region, and a fifth collector region which is spaced apart from the fifth base region by a fifth base-to-collector spacing dimension which provides the fifth BJT with a fifth trigger voltage, where the fifth base region and fifth emitter region are coupled to the first node and to the second node. The third shared BJT stack may also include a sixth BJT having a sixth base region, a sixth emitter region, and a sixth collector region which is spaced apart from the sixth base region by a sixth base-to-collector spacing dimension which provides the sixth BJT with a sixth trigger voltage, where the sixth base region and sixth emitter region are connected together and coupled to the shared reference voltage terminal. Each of the first, second, and third BJT stacks provides a trigger voltage that may be controlled by the base-to-collector spacing dimensions to be within a range of approximately 15-55 Volts. In this way, the first BJT stack and third shared BJT stack may be connected in series between the first integrated circuit pin and the shared reference voltage terminal to provide a first ESD clamp to protect the first integrated circuit pin against forward and reverse ESD transient events. In addition, the second BJT stack and third shared BJT stack may be connected in series between the second integrated circuit pin and the shared reference voltage terminal to provide a second ESD clamp to protect the second integrated circuit pin against forward and reverse ESD transient events. Depending on the different base-to-collector spacing dimensions of the constituent BJTs, the first ESD clamp may provide a first combined trigger voltage that is different from, or the same as, a second combined trigger voltage provided by the second ESD clamp. For example, the first, second, fifth, and sixth base-to-collector spacing dimensions may be selected to provide a first combined triggering voltage for protecting the first integrated circuit pin against ESD transient events, while the third, fourth, fifth, and sixth base-to-collector spacing dimensions may be selected to provide a second combined triggering voltage for protecting the second integrated circuit pin against ESD transient events which is different from the first combined triggering voltage. In operation, the first BJT stack and third shared BJT stack provide a forward polarity ESD discharge path between the first integrated circuit pin and the shared reference voltage terminal across the first plurality of bipolar transistors and the third plurality of bipolar transistors connected in series with one another. In addition, the first BJT stack provides a reverse polarity ESD discharge path between the first integrated circuit pin and the shared reference voltage terminal across one of the first plurality of bipolar transistors having an emitter connected to the first integrated circuit pin and a collector connected across a substrate diode to the shared reference voltage terminal.

In another form, there is provided a stacked electrostatic discharge protection clamp for protecting a plurality of signal pins on an integrated circuit. As disclosed, the ESD protection clamp includes a first NPN stack, second NPN stack, and first shared NPN stack. The first NPN stack is coupled between a first signal pin and a first circuit node such that a first terminal of the first NPN stack is coupled to a first signal pin and a second terminal of the first NPN stack is coupled to a first circuit node. In addition, the second NPN stack is coupled between a second signal pin and the first circuit node such that a first terminal of the second NPN stack is coupled to a second signal pin and a second terminal of the second NPN stack is coupled to the first circuit node. Finally, the first shared NPN stack is coupled between the first circuit node and a second circuit node such that a first terminal of the shared NPN stack is coupled to the first circuit node and a second terminal of the shared NPN stack is coupled to a second circuit node that is directly or indirectly connected to a reference voltage. In selected embodiments, the first NPN stack and first shared NPN stack are connected in series to form a first dual polarity ESD clamp for protecting the first signal pin, and the second NPN stack and first shared NPN stack are connected in series to form a second dual polarity ESD clamp for protecting the second signal pin. In this way, the first dual polarity ESD clamp protects the first signal pin against a first tier ESD voltage event, and the second dual polarity ESD clamp protects the second signal pin against a second tier ESD voltage event that is the same as, or different from, the first tier ESD voltage event. In other embodiments, one or more of the first NPN stack, second NPN stack and first shared NPN stack may include a top stage bipolar junction transistor device connected in series with a low stage bipolar junction transistor device. In addition, the top stage bipolar junction transistor and low stage bipolar junction transistor in the NPN stacks may have a designed breakdown voltage that is controlled by a lateral base-collector triggering spacing dimension between a p-well base region and an n-type collector region in said bipolar junction transistor. In other embodiments, the ESD protection clamp includes a third NPN stack coupled between a third signal pin and the second circuit node, and a second shared NPN stack coupled between the second circuit node and a third circuit node that is directly or indirectly connected to a reference voltage, where the third NPN stack and second shared NPN stack are connected in series to form a third dual polarity ESD clamp for protecting the third signal pin.

In yet other embodiments, there is disclosed a method and system for providing ESD protection. As disclosed, an electrostatic discharge (ESD) protection structure is connected to protect a plurality of protected terminals in an integrated circuit against positive and negative voltage ESD transients with a plurality of bipolar junction transistor (BJT) clamps which are formed with a shared BJT stack. As formed, the provided ESD protection structure includes a first BJT clamp formed in a semiconductor substrate and coupled between a first protected terminal and a first grounded terminal, where the first BJT clamp includes a first BJT stack coupled in series with a shared BJT stack. The first BJT stack and shared BJT stack are each formed with a pair of bipolar transistors sharing a common collector region, where each bipolar transistor has an emitter region that is connected to a base region with a base-to-collector spacing dimension which provides a predetermined trigger voltage for said bipolar transistor. The ESD protection circuit may also include a second BJT clamp formed in the semiconductor substrate and coupled between a second protected terminal and the first grounded terminal, where the second BJT clamp includes a second BJT stack coupled in series with the shared BJT stack. The second BJT stack is formed with a pair of bipolar transistors sharing a common collector region, where each bipolar transistor has an emitter region that is connected to a base region with a base-to-collector spacing dimension which provides a predetermined trigger voltage for said bipolar transistor. When a voltage is applied between the first protected terminal and the first grounded terminal of the integrated circuit that has a magnitude greater than a first predetermined trigger value, the first BJT clamp is triggered to enable current flow through the ESD protection structure substantially only when the voltage across the first protected terminal and first grounded terminal exceeds the first predetermined trigger value. Likewise, when a voltage is applied between the second protected terminal and the first grounded terminal of the integrated circuit that has a magnitude greater than a second predetermined trigger value, the second BJT clamp is triggered to enable current flow through the ESD protection structure substantially only when the voltage across the second protected terminal and first grounded terminal exceeds the second predetermined trigger value.

Although the described exemplary embodiments disclosed herein are directed to area-efficient, high voltage, single or dual polarity ESD protection devices targeted for narrow design windows and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to a p-type substrate, this is merely for convenience of explanation and not intended to be limiting and persons of skill in the art will understand that the principles taught herein apply to devices of either conductivity type. Accordingly, the identification of particular regions as N-type or P-type is merely by way of illustration and not limitation and opposite conductivity type regions may be substituted in order to form devices of opposite conductivity type. Moreover, the thicknesses and doping concentrations of the described layers may deviate from the disclosed ranges or values. In addition, the stacked clamps are described herein with reference to NPN bipolar junction transistors, but may also be formed with PNP bipolar junction transistors, NMOS transistors, PMOS transistors, or any other device which is capable of having an adjustable trigger voltage. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An electrostatic discharge (ESD) protection circuit for a plurality of integrated circuit pins, comprising:
    a first bipolar junction transistor (BJT) stack having a first terminal connected to a first integrated circuit pin and a second terminal connected to a first node and comprising a first plurality of bipolar transistors connected in series, each formed with a base-to-collector spacing dimension which provides a predetermined trigger voltage and with a collector region that is connected across a shared diode to a reference voltage;
    a second BJT stack having a first terminal connected to a second integrated circuit pin and a second terminal connected to a second node and comprising a second plurality of bipolar transistors connected in series, each formed with a base-to-collector spacing dimension which provides a predetermined trigger voltage and with a collector region that is connected across a shared diode to a reference voltage; and
    a third shared BJT stack having a first terminal connected to the first and second BJT stacks at the first and second nodes, respectively, and a second terminal coupled to a shared reference voltage terminal, the third shared BJT stack comprising a third plurality of bipolar transistors connected in series, each formed with a base-to-collector spacing dimension which provides a predetermined trigger voltage and with a collector region that is connected across a shared diode to a reference voltage.

2. The ESD protection circuit of claim 1, where the first BJT stack comprises:
    a first bipolar transistor comprising a first base region, a first emitter region, and a first collector region which is spaced apart from the first base region by a first base-to-collector spacing dimension which provides the first bipolar transistor with a first trigger voltage, where the first base region and first emitter region are connected to the first integrated circuit pin; and
    a second bipolar transistor comprising a second base region, a second emitter region, and a second collector region which is connected to the first collector region and which is spaced apart from the second base region by a second base-to-collector spacing dimension which provides the second bipolar transistor with a second trigger voltage, where the second base region and second emitter region are connected together to the first node.

3. The ESD protection circuit of claim 2, where the second BJT stack comprises:
    a third bipolar transistor comprising a third base region, a third emitter region, and a third collector region which is spaced apart from the third base region by a third base-to-collector spacing dimension which provides the third bipolar transistor with a third trigger voltage, where the third base region and third emitter region are connected to the second integrated circuit pin; and
    a fourth bipolar transistor comprising a fourth base region, a fourth emitter region, and a fourth collector region which is connected to the third collector region and which is spaced apart from the fourth base region by a fourth base-to-collector spacing dimension which provides the fourth bipolar transistor with a fourth trigger voltage, where the fourth base region and fourth emitter region are connected together to the second node.

4. The ESD protection circuit of claim 3, where the third shared BJT stack comprises:
    a fifth bipolar transistor comprising a fifth base region, a fifth emitter region, and a fifth collector region which is spaced apart from the fifth base region by a fifth base-to-collector spacing dimension which provides the fifth bipolar transistor with a fifth trigger voltage, where the fifth base region and fifth emitter region are coupled to the first node and to the second node; and
    a sixth bipolar transistor comprising a sixth base region, a sixth emitter region, and a sixth collector region which is connected to the fifth collector region and which is spaced apart from the sixth base region by a sixth base-to-collector spacing dimension which provides the sixth bipolar transistor with a sixth trigger voltage, where the sixth base region and sixth emitter region are connected together and coupled to the shared reference voltage terminal.

5. The ESD protection circuit of claim 1, where the first BJT stack and third shared BJT stack are connected in series between the first integrated circuit pin and the shared reference voltage terminal to provide a first ESD clamp to protect the first integrated circuit pin against forward and reverse ESD transient events.

6. The ESD protection circuit of claim 5, where the second BJT stack and third shared BJT stack are connected in series between the second integrated circuit pin and the shared reference voltage terminal to provide a second ESD clamp to protect the second integrated circuit pin against forward and reverse ESD transient events.

7. The ESD protection circuit of claim 6, where the first ESD clamp provides a first combined trigger voltage that is different from a second combined trigger voltage provided by the second ESD clamp.

8. The ESD protection circuit of claim 6, where the first ESD clamp provides a first combined trigger voltage that is the same as a second combined trigger voltage provided by the second ESD clamp.

9. The ESD protection circuit of claim 3, where the first base-to-collector spacing dimension is different from the third base-to-collector spacing dimension.

10. The ESD protection circuit of claim 3, where the second base-to-collector spacing dimension is different from the fourth base-to-collector spacing dimension.

11. The ESD protection circuit of claim 4, where the first, second, fifth, and sixth base-to-collector spacing dimensions are selected to provide a first combined triggering voltage for protecting the first integrated circuit pin against ESD transient events.

12. The ESD protection circuit of claim 11, where the third, fourth, fifth, and sixth base-to-collector spacing dimensions are selected to provide a second combined triggering voltage for protecting the second integrated circuit pin against ESD transient events.

13. The ESD protection circuit of claim 1, where each of the first, second, and third BJT stacks provides a trigger voltage that may be controlled by the base-to-collector spacing dimensions to be within a range of approximately 15-55 Volts.

14. The ESD protection circuit of claim 1, where the first BJT stack and third shared BJT stack provide a forward polarity ESD discharge path between the first integrated circuit pin and the shared reference voltage terminal across the first plurality of bipolar transistors and the third plurality of bipolar transistors connected in series with one another.

15. The ESD protection circuit of claim 1, where the first BJT stack provides a reverse polarity ESD discharge path between the first integrated circuit pin and the shared reference voltage terminal across one of the first plurality of bipolar transistors having an emitter connected to the first integrated circuit pin and a collector connected across a substrate diode to the shared reference voltage terminal.

16. A stacked electrostatic discharge (ESD) protection circuit for protecting a plurality of signal pins on an integrated circuit, comprising:
   a first NPN stack having a first terminal coupled to a first signal pin, a second terminal coupled to a first circuit node, and a first pair of NPN transistors sharing a common collector region that is connected across a shared diode to a reference voltage;
   a second NPN stack having a first terminal coupled to a second signal pin, a second terminal coupled to the first circuit node, and a second pair of NPN transistors sharing a common collector region that is connected across a shared diode to the reference voltage; and
   a first shared NPN stack having a first terminal coupled to the first circuit node, second terminal coupled to a second circuit node that is directly or indirectly connected to a reference voltage terminal, and a third pair of NPN transistors sharing a common collector region that is connected across a shared diode to the reference voltage.

17. The stacked ESD protection circuit of claim 16, where the first NPN stack and first shared NPN stack are connected in series to form a first dual polarity ESD clamp for protecting the first signal pin, and where the second NPN stack and first shared NPN stack are connected in series to form a second dual polarity ESD clamp for protecting the second signal pin.

18. The stacked ESD protection circuit of claim 17, where the first dual polarity ESD clamp protects the first signal pin against a first tier ESD voltage event, and where the second dual polarity ESD clamp protects the second signal pin against a second tier ESD voltage event that is different from the first tier ESD voltage event.

19. The stacked ESD protection circuit of claim 17, where the first dual polarity ESD clamp protects the first signal pin against a first tier ESD voltage event, and where the second dual polarity ESD clamp protects the second signal pin against a second tier ESD voltage event that is the same as the first tier ESD voltage event.

20. The stacked ESD protection circuit of claim 16, where the each of the first NPN stack, second NPN stack and first shared NPN stack comprises a top stage bipolar junction transistor device connected in series with a tow stage bipolar junction transistor device.

21. The stacked ESD protection circuit of claim 20, where each top stage bipolar junction transistor and low stage bipolar junction transistor in the first NPN stack, second NPN stack and first shared NPN stack has a designed breakdown voltage that is controlled by a lateral base-collector triggering spacing dimension between a p-well base region and an n-type collector region in said bipolar junction transistor.

22. The stacked ESD protection circuit of claim 16, further comprising:
   a third NPN stack having a first terminal coupled to a third signal pin and second terminal coupled to the second circuit node; and
   a second shared NPN stack having a first terminal coupled to the second circuit node and a second terminal coupled to a third circuit node that is directly or indirectly connected to the reference voltage terminal, where the third NPN stack and second shared NPN stack are connected in series to form a third dual polarity ESD clamp for protecting the third signal pin.

23. A method comprising:
providing an electrostatic discharge (ESD) protection structure connected to protect a plurality of protected terminals in an integrated circuit against positive and negative voltage ESD transients with a plurality of bipolar junction transistor (BJT) clamps which are formed with a shared BJT stack, wherein the ESD protection structure comprises:
   (a) a first BJT clamp formed in a semiconductor substrate with a first terminal coupled to a first protected terminal and a second terminal connected to a first grounded terminal, the first BJT clamp comprising a first BJT stack coupled in series with a shared BJT stack, where the first BJT stack and shared BJT stack are each formed with a pair of bipolar transistors sharing a common collector region that is connected across a shared diode to a reference voltage, where each bipolar transistor has an emitter region that is connected to a base region with a base-to-collector spacing dimension which provides a predetermined trigger voltage for said bipolar transistor; and
   (b) a second BJT clamp formed in the semiconductor substrate with a first terminal connected to a second protected terminal and a second terminal coupled to the first grounded terminal, the second BJT clamp comprising a second BJT stack coupled in series with the shared BJT stack, where the second BJT stack is formed with a pair of bipolar transistors sharing a common collector region that is connected across a shared diode to a reference voltage, where each bipolar transistor has an emitter region that is connected to a base region with a base-to-collector spacing dimension which provides a predetermined trigger voltage for said bipolar transistor; and applying a voltage between the either first protected terminal and the first grounded terminal of the integrated circuit to trigger the first BJT clamp, or the second protected terminal and the first grounded terminal of the integrated circuit to trigger the second BJT clamp.

\* \* \* \* \*

UNITED STATES PATENT AND TRADEMARK OFFICE
CERTIFICATE OF CORRECTION

| | | |
|---|---|---|
| PATENT NO. | : 8,743,516 B2 | Page 1 of 1 |
| APPLICATION NO. | : 13/451312 | |
| DATED | : June 3, 2014 | |
| INVENTOR(S) | : Chai Ean Gill et al. | |

It is certified that error appears in the above-identified patent and that said Letters Patent is hereby corrected as shown below:

In the Claims

Claim 20, column 22, line 16 should read "transistor device connected in series with a low stage bipolar"

Signed and Sealed this
Twenty-sixth Day of August, 2014

Michelle K. Lee
*Deputy Director of the United States Patent and Trademark Office*